(12) United States Patent
Emmanuel et al.

(10) Patent No.: US 11,005,512 B2
(45) Date of Patent: *May 11, 2021

(54) ACTIVE ANTENNA FOR WIRELESS LOCAL AREA NETWORK DEVICES

(71) Applicant: NETGEAR, INC., San Jose, CA (US)

(72) Inventors: Joseph Amalan Arul Emmanuel, Cupertino, CA (US); Shun-Liang Yu, Milpitas, CA (US); Mark G. Merrill, Atherton, CA (US); Peiman Amini, Mountain View, CA (US)

(73) Assignee: NETGEAR, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/277,648

(22) Filed: Feb. 15, 2019

(65) Prior Publication Data

US 2019/0181899 A1   Jun. 13, 2019

Related U.S. Application Data

(63) Continuation of application No. 15/260,102, filed on Sep. 8, 2016, now Pat. No. 10,211,867.

(Continued)

(51) Int. Cl.
*H04B 1/18* (2006.01)
*H03H 11/34* (2006.01)

(Continued)

(52) U.S. Cl.
CPC .............. *H04B 1/18* (2013.01); *H03H 11/123* (2013.01); *H03H 11/346* (2013.01);

(Continued)

(58) Field of Classification Search
CPC .......... H04B 1/18; H04B 1/48; H03H 11/346; H03H 11/123; H03H 11/348;

(Continued)

(56) References Cited

U.S. PATENT DOCUMENTS 6,148,217 A * 11/2000 Skarby ................... H01Q 1/246
                                                         455/125
2004/0116084 A1   6/2004 Ward et al.
(Continued)

FOREIGN PATENT DOCUMENTS

| CN | 102204014 A | 9/2011 |
|---|---|---|
| CN | 103730715 A | 4/2014 |
| EP | 1443687 A1 | 8/2004 |

OTHER PUBLICATIONS

"EMI, RFI, and Shielding Concepts", Analog Devices; MT-095 Tutorial; retrieved online from url: http://analog.com/media/en/training-seminars/tutorials/MT-095.pdf; 2009, pp. 1-16.

(Continued)

*Primary Examiner* — Un C Cho
*Assistant Examiner* — Lalita W Pace
(74) *Attorney, Agent, or Firm* — Perkins Coie LLP

(57) ABSTRACT

Various embodiments are described herein that improve the signal reception and transmission capabilities of an access point by coupling an active antenna assembly to the access point. An active antenna assembly includes an antenna and at least one active component, such as a low-noise amplifier or a power amplifier. The active component can be connected to an antenna circuit board rather than the main circuit board of the access point, which is typically retained within an access point housing. By positioning the active component near the antenna, the active antenna assembly prevents degradation of signals received by the antenna. One or more coaxial cables can be used to connect the active component of the active antenna assembly to the main circuit board of the access point.

18 Claims, 8 Drawing Sheets

Related U.S. Application Data

(60) Provisional application No. 62/234,816, filed on Sep. 30, 2015.

(51) Int. Cl.
*H03H 11/12* (2006.01)
*H04B 1/48* (2006.01)
*H04W 84/12* (2009.01)

(52) U.S. Cl.
CPC ............ *H03H 11/348* (2013.01); *H04B 1/48* (2013.01); *H04W 84/12* (2013.01)

(58) Field of Classification Search
CPC ........... H03H 2210/021; H04W 84/12; H04W 72/0453; H04W 72/082; H04W 88/02; H04W 88/08; H04W 88/16; H01Q 23/00; H01L 2924/14215; H01L 2924/1424; H03F 2200/432; H03F 2200/429; H03F 2200/451; H03F 2200/294
See application file for complete search history.

(56) References Cited

U.S. PATENT DOCUMENTS

| | | | |
|---|---|---|---|
| 2004/0192392 A1* | 9/2004 | Hoppenstein | H01Q 1/246 |
| | | | 455/562.1 |
| 2004/0209611 A1 | 10/2004 | Van | |
| 2005/0101191 A1* | 5/2005 | Kim | H04B 1/48 |
| | | | 439/638 |
| 2006/0217149 A1* | 9/2006 | Yang | H04B 1/38 |
| | | | 455/556.1 |
| 2007/0152903 A1 | 7/2007 | Lin et al. | |
| 2007/0264934 A1* | 11/2007 | Holder | H04B 1/18 |
| | | | 455/13.3 |
| 2008/0175212 A1 | 7/2008 | Angell et al. | |
| 2009/0283296 A1 | 11/2009 | Shimosawa et al. | |
| 2012/0021790 A1* | 1/2012 | Kister | H04B 1/18 |
| | | | 455/507 |
| 2013/0009704 A1 | 1/2013 | Liao | |
| 2014/0104116 A1 | 4/2014 | Chiu et al. | |
| 2016/0020817 A1* | 1/2016 | Chen | H04B 17/12 |
| | | | 370/278 |

OTHER PUBLICATIONS

Borowicz, Brittney, "Wi-Fi—High Performance (A11) Modules", retrieved online from url: https://gridconnect.com/blog/tag/access-point/; pp. 1-4.

* cited by examiner

ACTIVE ANTENNA FOR WIRELESS LOCAL AREA NETWORK DEVICES

CROSS-REFERENCE TO RELATED APPLICATIONS

This application is a continuation of U.S. application Ser. No. 15/260,102, titled "ACTIVE ANTENNA FOR WIRELESS LOCAL AREA NETWORK DEVICES" and filed on Sep. 8, 2016, now U.S. Pat. No. 10,211,867, which claims priority to U.S. Provisional Application No. 62/234,816, titled "ACTIVE ANTENNA FOR IMPROVED RECEIVE SENSITIVITY AND TRANSMIT POWER ON A WLAN RADIO" and filed on Sep. 30, 2015.

RELATED FIELD

Various of the disclosed embodiments concern antennas for wireless devices, and more particularly, active antennas having improved signal sensitivity and signal transmission capabilities.

BACKGROUND

One key metric for improving wireless performance in printed circuit board design and industrial design is minimizing the degradation of a signal between the antenna (i.e., where the signal was received or is to be transmitted) and an active element of a receiver or transmitter. The active component is typically positioned on a printed circuit board ("board") within the housing of a WLAN device, also referred to as a wireless access point ("access point"). However, a loss occurs between the active component and the antenna due to the physical dimensions of the access point. For example, signals received by the antenna will begin to degrade as they travel toward an active component, such as a low-noise amplifier ("LNA") as shown in FIG. 1. Similarly, signals to be transmitted by the antenna will begin to degrade as they travel away from an active component, such as a power amplifier ("PA") as shown in FIG. 2.

But these losses can negative affect the access point's sensitivity to received signals, signal-to-noise ratio (SNR), transmission power (i.e., the strength of signals transmitted by the WLAN device), and/or transmission quality. Note also that signals received or transmitted by the access point can be further degraded due to the presence of radio frequency ("RF") switches, such as transmit/receive ("T/R") switches, band select switches, diplexers, etc.

Due to design constraints (e.g., thermal-related and antenna-related limitations), access points are often relatively large. Therefore, the antenna and the first active element in the receive path (e.g., a low-noise amplifier) could be several centimeters apart from one another. Similarly, the last active element in the transmit path (e.g., a power amplifier) and the antenna may be several centimeters away from one another.

Many access points utilize an external antenna in an attempt to improve the performance (e.g., the transmission and reception capabilities) of the access point. External antennas are positioned outside of the device housing and are connected to the board using RF cables, rather than being coupled to the board directly. However, because these arrangements move the antenna even further away from the active component(s) of the board, the signal experiences further losses. These losses result in a decrease in the SNR of received signals that cannot be recovered. In other words, there is a direct impact to the noise figure as the length of the receive path and/or the transmit path increases.

Consequently, the first active component is often positioned on the board near an IPEX connector or between an integrated circuit for the network and an RF connector. But the first active component is still not near the antenna, which receives and transmits signals on behalf of the access point.

Asymmetric Link for Access Points

A wireless communication link between an access point and a client device is often highly asymmetrical. Said another way, the power of signals transmitted by the client device to the access point is usually lower than the power of signals transmitted by the access point to the client device. Moreover, the efficiency of the antenna(s) on the client device is generally lower. And, in some instances, the power of signals transmitted by the client device is decreased even further before reaching the access point. For example, signals transmitted by a portable client device that is carried by a user may be lower due to signal absorption by the human body.

A basic service set ("BSS") includes the access point and at least one client device. When a client device joins a BSS, an exchange occurs between each client device and the access point in which the access point receives control or management frames from each client device. The client device(s) are not able to be a part of the BSS unless the necessary control and management frames are received or "heard" by the access point.

WLAN protocol also typically requires wireless devices involved in an exchange of data packets to receive an acknowledgment and a response (an "ACK/BACK") for each data packet that is transmitted in the downlink direction. Together, the wireless devices represent opposite ends of a communication link. If one of the wireless devices does not (or cannot) receive an ACK/BACK from the other wireless device, then no data packets are conveyed to the other wireless device. Because of communication link asymmetry, the ability of an access point to receive data signals is key in maintaining downlink throughput and a reliable connection to the client device.

Further yet, the total amount of uplink traffic continues to rapidly increase as more client devices are used for interactive media, social media, and other bandwidth-intensive applications. Consequently, many users of client devices desire or require a high data rate when exchanging data packets with the access point. But many of these client devices have a low transmission signal strength. Therefore, it is desirable for access points to have improved signal sensitivity and signal transmission capabilities.

SUMMARY

Various embodiments are described herein that improve the uplink and downlink throughout of a client device communicatively coupled to the access point by coupling the access point to an active antenna assembly. Deployment of an active antenna assembly may also extend the range of an access point by improving the SNR at the input of the receiver (e.g., a WLAN chipset receiver) of the access point.

An active antenna assembly includes an antenna and at least one active component, which is preferably positioned on a separate circuit board in the communication path. For example, the active component (e.g., an LNA or a PA) may be connected to an antenna circuit board rather than the main circuit board of the access point. Placing the active component near the antenna enables the access point to (1) route power to the active component (as well as other components); and (2) route control signals to the active component.

The active component of the active antenna assembly can be connected to the main circuit board of the access point via one or more coaxial cables, ribbon cables, etc. For example, multiple coaxial cables and low-noise downconverters may be used by a dual-band active antenna assembly to improve the signal transmission and reception capabilities of two different frequency bands (e.g., 2.4 GHz and 5 GHz). The multiple coaxial cables carry the RF signals in each band from the active component of the active antenna assembly to the main circuit board of the access point.

Each of the coaxial cables can include a copper shield that is composed of braided copper wire and may be used as an RF ground. In some embodiments, the copper shield of one coaxial cable is used to carry an analog and/or digital control signal, while the copper shield of the other coaxial cable is used to carry a digital power supply voltage. Capacitors could also be used to ground the copper shield of either coaxial cable. For example, capacitors may be connected to both ends of one coaxial cable (e.g., at a first end connected to the active antenna assembly and a second end connected to the main circuit board of the access point) in order to ground the coaxial cable.

BRIEF DESCRIPTION OF THE DRAWINGS

One or more embodiments of the present disclosure are illustrated by way of example and not limitation in the figures of the accompanying drawings, in which like references indicate similar elements.

Figure 1:
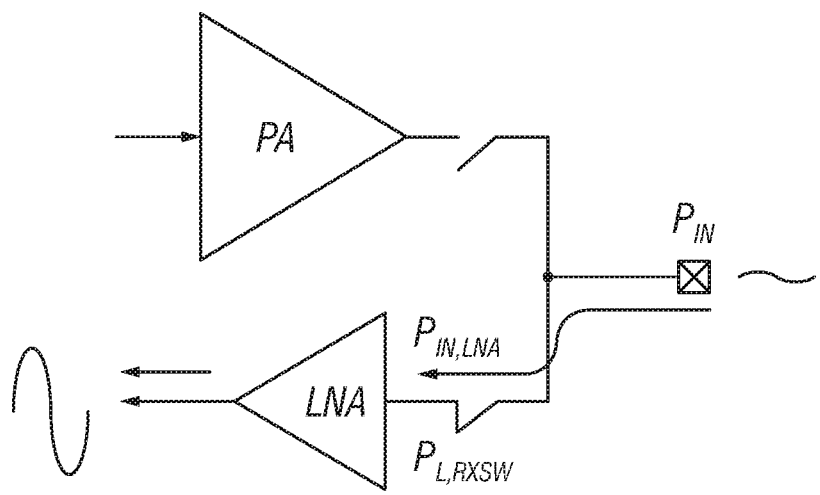
FIG. 1 is a schematic diagram showing losses in RF signal strength along the receive path of a conventional wireless device.
Figure 2:
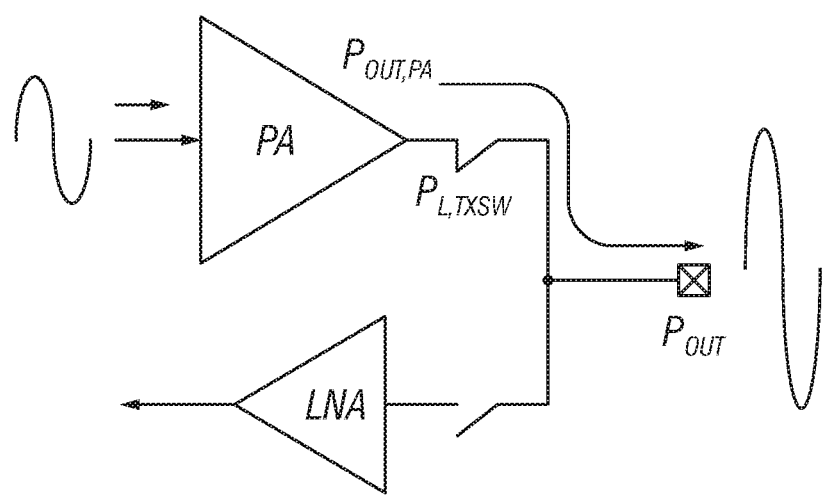
FIG. 2 is a schematic diagram showing losses in RF signal strength along the transmit path of a conventional wireless device.

Those skilled in the art will appreciate that the logic and process steps illustrated in the flow diagrams discussed below may be altered in a variety of ways. For example, the order of the logic may be rearranged, sub-steps may be performed in parallel, illustrated logic may be omitted, other logic may be included, etc. Moreover, certain steps may be consolidated into a single step and/or actions represented by a single step may be alternatively represented as a collection of sub-steps. The figures are designed to make the disclosed concepts more comprehensible to a human reader. Those skilled in the art will also appreciate that any data structures used to store this information may differ from the figures and/or tables shown, in that the data structures may, for example, be organized in a different manner, contain more or less information than shown, be compressed, scrambled, and/or encrypted, etc.

DETAILED DESCRIPTION

The following description provides certain details for a thorough understanding and enabling description of various embodiments. One skilled in the relevant technology will understand, however, that some embodiments may be practiced without many of these details.

Likewise, one skilled in the relevant technology will also understand that some of the embodiments may include other features not described herein. Some well-known structures or functions may not be shown or described in detail in order to avoid unnecessarily obscuring the relevant descriptions of the various embodiments.

The terminology used below is to be interpreted in its broadest reasonable manner, even though it is being used in conjunction with a detailed description of specific examples and embodiments.

Active Antennas for Access Points

The noise figure ("NF") and noise factor ("F") are often used to quantify the degradation of the signal-to-noise ratio ("SNR") caused by components in a radio frequency ("RF") signal communication path, which may also be referred to as an RF signal chain. Said another way, both the NF and F for an access point are dependent on the physical hardware components of that access point. Thus, the NF and F are important factors to consider when attempting to improve the wireless performance capabilities of an access point.

Conventional access points typically experience degradation to the strength of received signals and transmitted signals due to the positioning of certain components. Various embodiments described herein position an active component near the antenna in order to avoid signal loss between the antenna and the main circuit board of the access point. More specifically, an active component can be placed on an antenna circuit board in order to decrease the communication path length between the antenna and the first active component on the receive path (or last active component on the transmit path) traversed by RF signals. Both the receive path and the transmit path may be referred to as a "communication path" of an RF signal.

Figure 3:
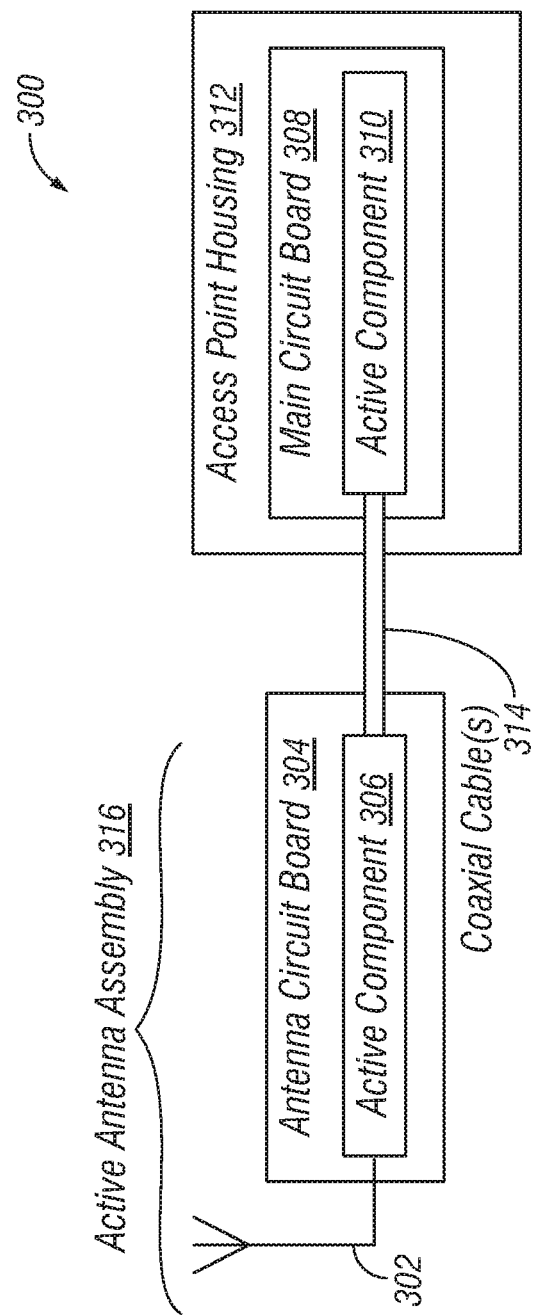
FIG. 3 is a simplified block diagram of an access point that includes an active antenna assembly.

FIG. 3 is a simplified block diagram of an access point 300 that includes an active antenna assembly 316, which is configured to improve signal reception and transmission capabilities of the access point 300. Traditionally, the first active component has been located on the main circuit board 308 of the access point 300. However, as noted above, this configuration causes the RF signal to degrade before reaching the active component. By positioning an active component 306 near the antenna(s) 302 used by an access point 300 (e.g., on the antenna circuit board 306), the quality and strength of received and transmitted RF signals can be improved.

In some embodiments, both the uplink and downlink throughout of a client device communicatively coupled to the access point are also improved by coupling the access point to an active antenna assembly 316. The client device is any network-accessible device that connects to a computer network via the access point 300, such as a mobile phone, tablet, or laptop computer. One or more processors on the antenna circuit board 304 and/or main circuit board 308 may be configured to establish an association with the client device across a network (e.g., in accordance with IEEE standard 802.11).

Together, the active antenna assembly 316 and access point housing 312 form the access point 300. As further described below, in some embodiments, the active antenna assembly 316 and the access point housing 312 are coupled to one another using one or more coaxial cables 314.

An active antenna assembly 316 includes an antenna 302 and at least one active component 306, which is preferably positioned on a separate circuit board in the communication path. For example, the active component 306 (e.g., a low-noise amplifier or a power amplifier) may be connected to the antenna circuit board 304 (rather than the main circuit board 308 within the access point housing 312). Because the antenna circuit board 304 is powered and has its own active element(s) 306, the antenna 302 can be referred to as an "active antenna."

Placing the active component 306 near the antenna 302 (e.g., on the antenna circuit board 304) enables the access point 300 to (1) route power to the active component 306 (as well as other components); and (2) route control signals to the active component 306. Deployment of an active antenna assembly 316 may also extend the range of an access point 300 by improving the SNR at the input of the receiver (e.g., a WLAN chipset receiver).

Some embodiments include a mechanism that enables one or more light emitting diodes (LEDs) on the antenna circuit board to be turned on and off. The LED(s) may be used, for example, to indicate whether the active antenna assembly is powered on or off. Some embodiments also include a signaling mechanism, such as a mechanical switch or button, that enables a user to turn the LED(s) on and off. The user could be an owner or operator of the access point. One or more manufacturing test methodologies may be used to test the various features of the active antenna assemblies in mass production.

Figure 4:
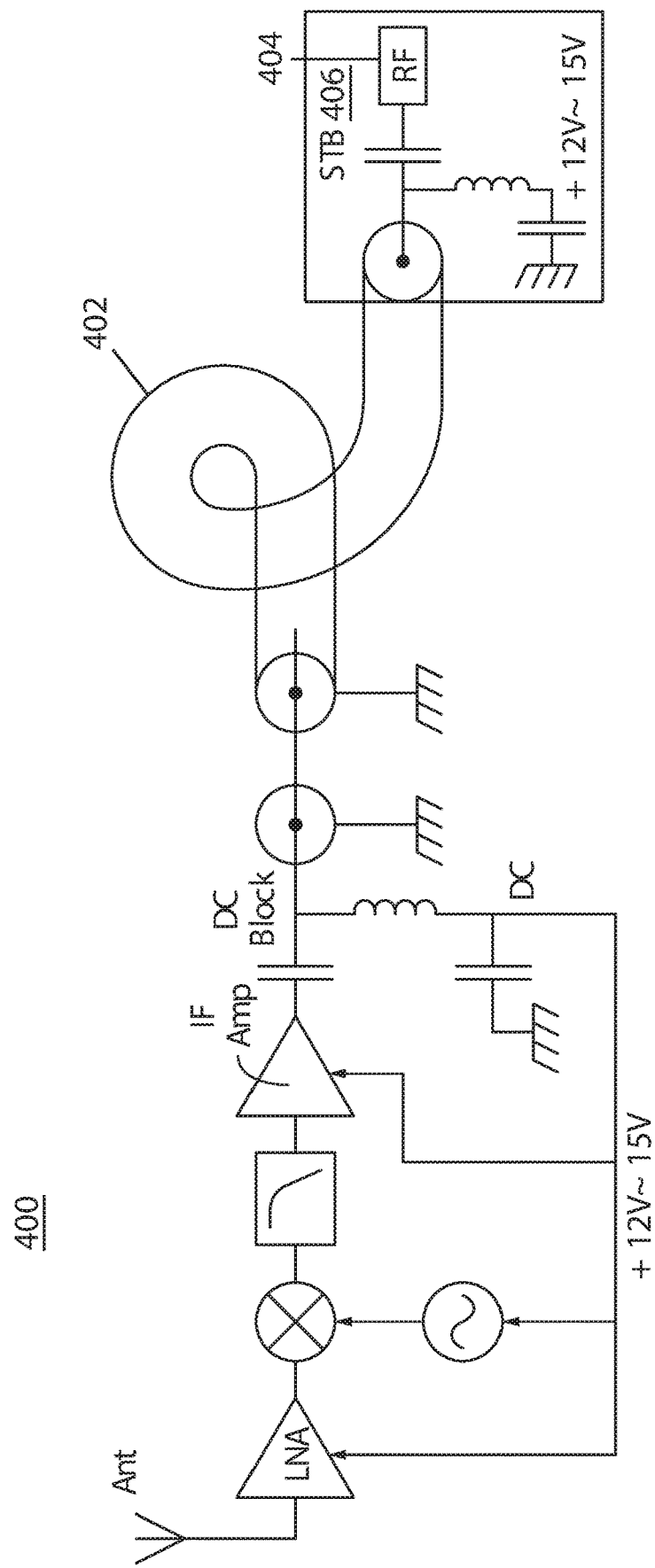
FIG. 4 is a schematic diagram of a conventional low-noise block downconverter.

FIG. 4 is a schematic diagram of a conventional low-noise block downconverter 400, which may be used for satellite television and other applications. Low-noise block downconverters typically include a coaxial cable 402 that carries power to an RF circuit 404 and an amplified intermediate frequency ("IF") signal to a set top box 406. Often, the RF circuit 404 is mounted to a satellite dish configured to receive the amplified IF signal.

Figure 5:
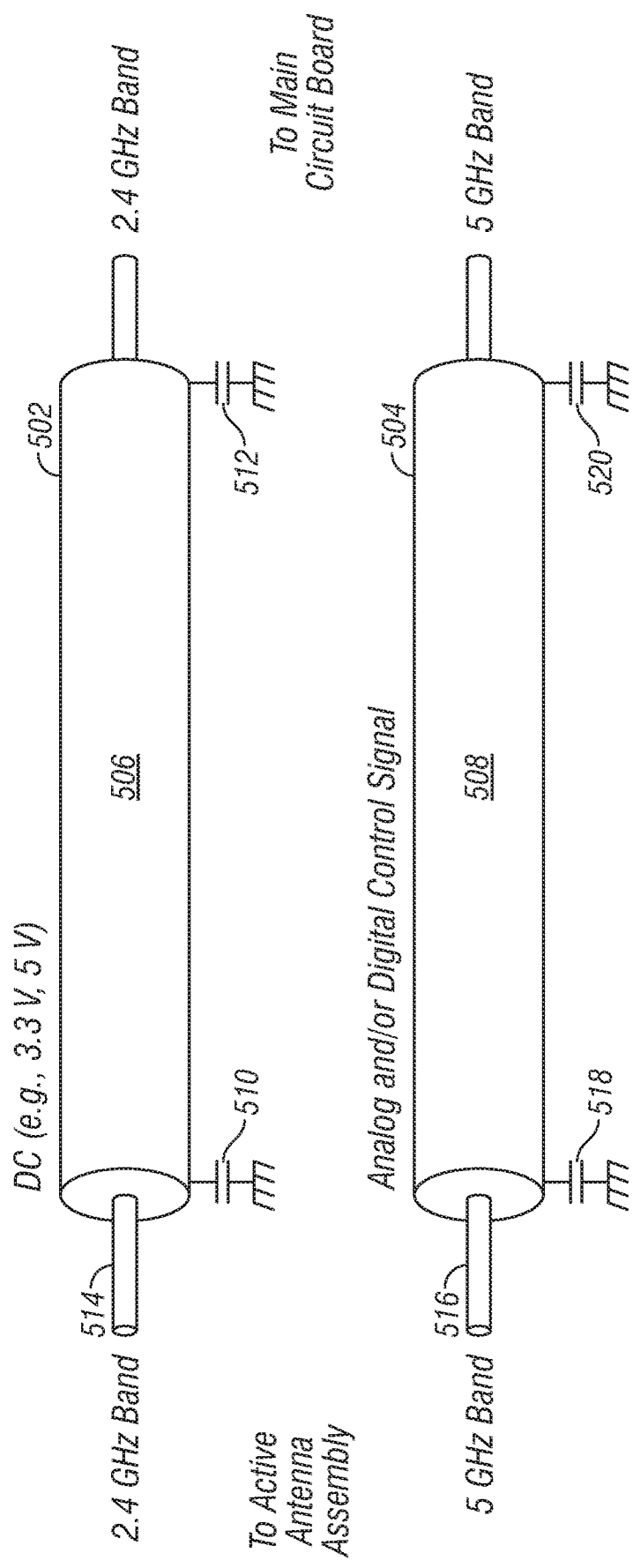
FIG. 5 depicts how multiple coaxial cables can be configured to receive and transmit RF signals in accordance with the techniques described herein.

FIG. 5 depicts how multiple coaxial cables can be configured to receive and transmit RF signals in accordance with the techniques described herein. More specifically, FIG. 5 illustrates how multiple coaxial cables 502, 504 and low-noise downconverters can be used by a dual-band active antenna assembly to improve the signal transmission and reception capabilities of an access point. The dual frequency bands ("bands") can be, for example, 2.4 GHz and 5 GHz, sub-1 GHz and 5 GHz, or any other desired set of bands. The coaxial cables 502, 504 carry the RF signals in each band from the active component of the active antenna assembly to the active component of the main circuit board of the access point.

Although 2.4 GHz and 5 GHz are used as example dual bands herein, one skilled in the art will recognize other bands could also be used. The coaxial cables could also carry direct current (e.g., 3.3 V, 5 V) power rails for the active antenna assembly, control signals for the 2.4 GHz communication path (e.g., a signal to control a 2.4 GHz T/R switch or an LNA), control signals for the 5 GHz communication path (e.g., a signal to control a 5 GHz T/R switch or an LNA), and/or power for a mechanism for turning one or more LEDs on and off. The LED(s) may be used to indicate that the access point includes an active antenna assembly or that the active antenna assembly is powered, and the LED(s) could be turned on or off by a user as desired.

Each of the coaxial cables can include a copper shield 506, 508 that is composed of braided copper wire. The copper shield may be used as an RF ground similar to the conventional methodology described above. In some embodiments, the copper shield 508 of the coaxial cable corresponding to the 5 GHz band is also used to carry an analog and/or digital control signal. Moreover, in some embodiments, the copper shield 506 of the coaxial cable corresponding to the 2.4 GHz band is used to carry a digital power supply voltage ("Vcc").

Capacitors 510, 512 could be used to ground the copper shield of either coaxial cable. For example, capacitors 510, 512 may be connected to both ends of the 2.4 GHz coaxial cable (e.g., at a first end connected to the active antenna assembly and a second end connected to the main circuit board of the access point) in order to ground the 2.4 GHz coaxial cable. The capacitors 510, 512 enable the copper shield 506 to act as the ground for the RF signals in the 2.4 GHz band.

The RF signals in the 2.4 GHz band may remain isolated from DC ground in order to supply voltage to a low-frequency digital control line. In such embodiments, the copper core 514 of the coaxial cable 502 carries the analog and/or digital control signal. Copper cores 514, 516 are typically less transient (i.e., are able to respond more rapidly) when the digital control signal is turned on or off. This is due, at least in part, to the lack of a connection between the copper cores 514, 516 of the coaxial cables 502, 504 and the capacitors 510, 512, 518, 520 that may be used to ground the 2.4 GHz and 5 GHz RF signals.

In some embodiments, the copper shield 506 of the 2.4 GHz coaxial cable 502 is used to carry the digital power supply voltage ("Vcc") rather than the copper shield 508 of the 5 GHz coaxial cable 504. Such a configuration may be preferred in some instances because grounding the 2.4 GHz band with a capacitor typically causes less degradation of the RF signal than grounding the 5 GHz band with a capacitor. Said another way, the behavior of capacitors is typically more predictableapp when used to ground the 2.4 GHz band rather than the 5 GHz band. Thus, capacitors 518, 520 may be present only in some embodiments.

The capacitor(s) 510, 512 corresponding to the 2.4 GHz RF signal are typically located as close as possible to where the copper shield 506 is connected to the antenna circuit board of the active antenna assembly and the main circuit board of the access point, respectively. As noted above, as the distance between these locations increases, the signal reception and transmission capabilities of the access point are often affected (e.g., degradation of the RF signal can occur). Consequently, it is important for the capacitor(s) 510, 512 to be near the antenna and main circuit board.

Figure 6:
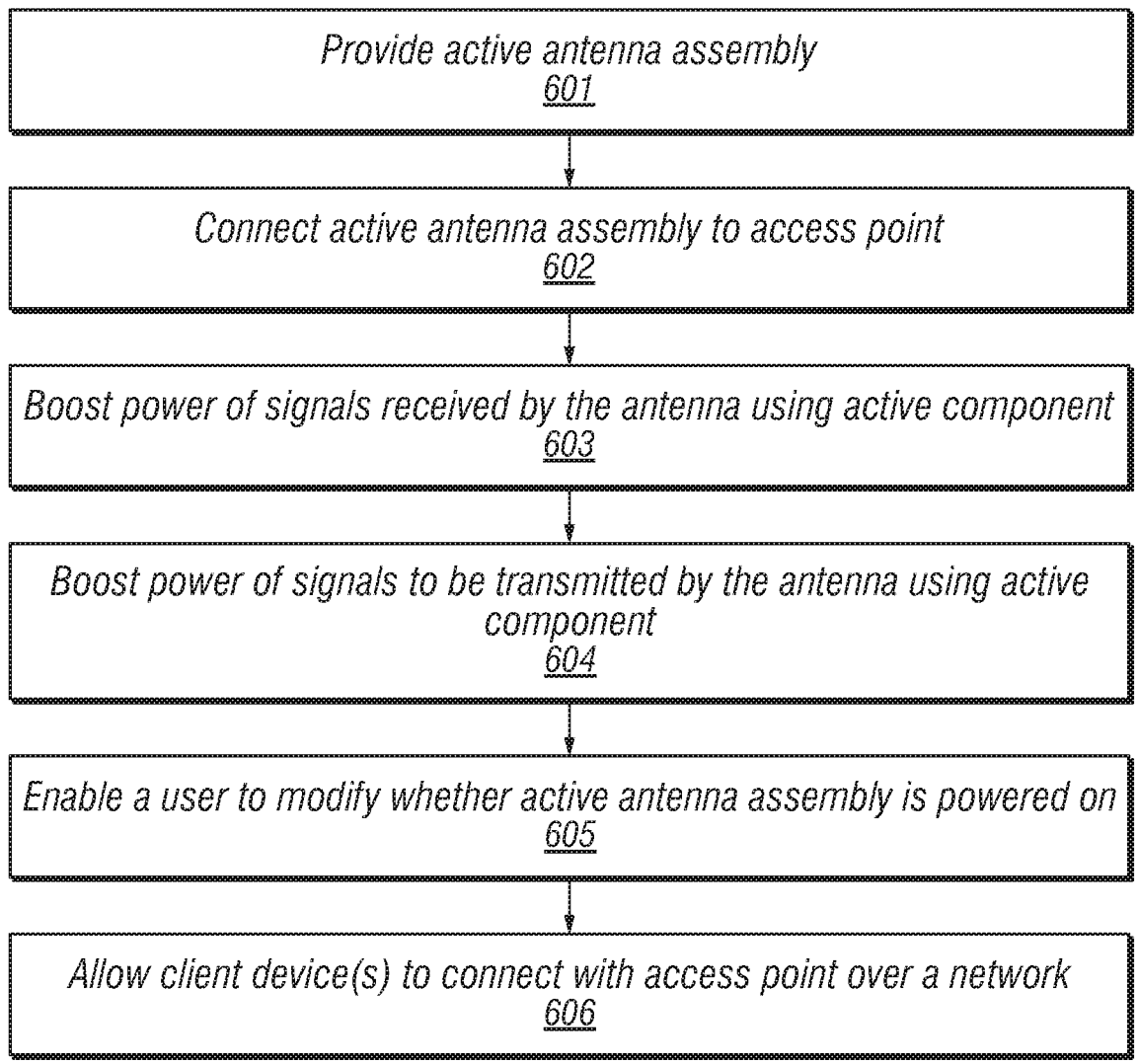
FIG. 6 depicts a process for improving the signal reception and/or transmission capabilities of an access point.

FIG. 6 depicts a process for improving the signal reception and/or transmission capabilities of an access point. An active antenna assembly is initially provided (step 601) that includes an antenna and at least one active component. Generally, the active component is connected to an antenna circuit board. The active antenna assembly is coupled to the access point (step 602). More specifically, the active component of the active antenna assembly is coupled to the main circuit board of the access point. The main circuit board can be retained within an access point housing, and may also include an active component.

The power of RF signals received by the antenna can then be boosted by the active component of the active antenna assembly before being forwarded to the main circuit board (step 603). Similarly, the power of signals to be transmitted by the antenna (e.g., to a client device across a network) can be boosted by the active component of the active antenna assembly prior to transmission (step 604).

In some embodiments, the access point includes a mechanism that enables the user to modify whether the active antenna assembly is powered on (step 605). When the active antenna assembly is powered on, the access point could be accessible to client devices (step 606), which are able to utilize the access point's improved signal reception and transmission capabilities. For example, the client devices may experience higher uplink and downlink throughput, better signal quality, etc.

Using Different Voltages to Carry a Control Signal

Figure 7:
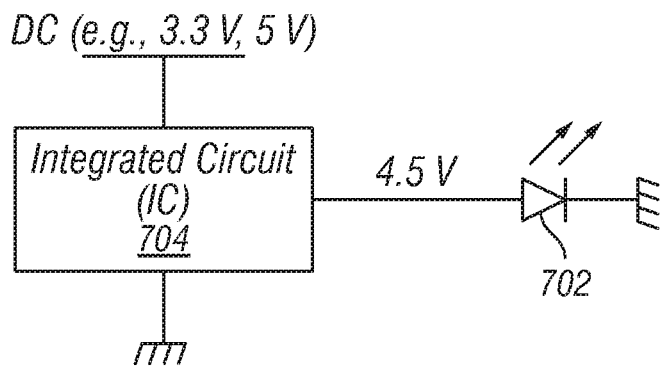
FIG. 7 is a schematic diagram depicting how an antenna circuit board can be coupled to the main circuit board of an access point.

FIG. 7 is a simplified schematic diagram illustrating how different voltages can be used to turn an LED on and off. Multiple voltages (e.g., 3.3 V and 5 V) can be used to control an LED signal for an LED 702 positioned on or near an access point. The voltage values used herein are meant to be illustrative only. The multiple voltages are selected such that they are in a range within which the components of the access point (e.g., active antenna assembly) are designed to function. For example, LNAs, T/R switches, etc., may be able to function at either 3.3 V or 5 V.

A power-on-reset integrated circuit (IC) 704 could also be used as a comparator to detect the multiple voltages and determine whether the LED 702 is to be turned on or off. For example, detection of a 3.3 V signal may cause the IC 704 to turn the LED 702 on, and detection of a 5 V signal may cause the IC 704 to turn the LED 702 off. As another example, the IC 704 could be configured to turn the LED 702 on so long as a voltage is detected.

Communication Path of an Active Antenna

Figure 8:
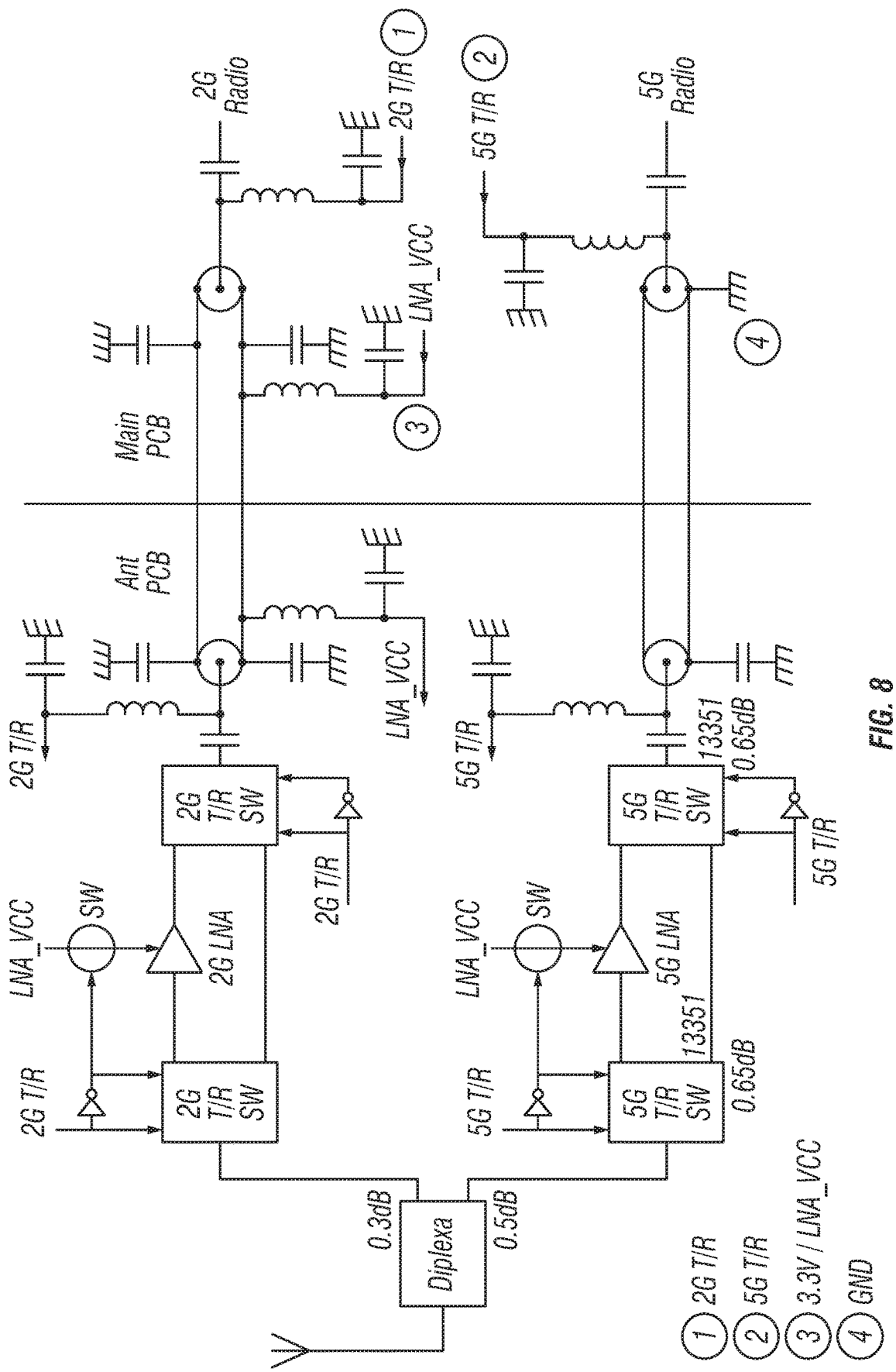
FIG. 8 is a schematic diagram showing single-band and dual-band active transmission and reception antennas.

FIG. 8 is a schematic diagram depicting how an antenna circuit board can be coupled to the main circuit board of an access point. How the antenna circuit board and main circuit board are connected to one another affects the communication path traversed by RF signals received by the antenna and RF signals forwarded to the antenna by the main circuit board for transmission downstream (e.g., to a client device). Here, for example, a receive path is illustrated in which RF signals are received by the antenna and passed to the main circuit board using active component(s) and coaxial cable(s).

Trace losses (as well as other forms of loss) occur between the antenna and the antenna port of the access point that cause the power and/or quality of the RF signal to be reduced. Simply increasing the gain of a transmission amplifier on the main circuit board is generally not sufficient to mitigate the losses experienced by the RF signal. When the gain of the transmission amplifier is increased, the transmission amplifier becomes more non-linear and the signal quality (e.g., the error vector magnitude (EVM)) degrades. As the signal quality degrades, the range and throughput of the access point decrease. This typically limits the data rate of client devices that connect to the access point and can also prevent streams in a multiple-input and multiple-output (MIMO) system from working as intended.

Non-linearity of the transmission amplifier can also cause out-of-band emissions. Regulations (e.g., those promulgated by the Federal Communications Commission in the United States and European Telecommunications Standards Institute in Europe) limit the amount of power that can be transmitted outside of a frequency band. Therefore, increasing the transmission power may not be possible where out-of-band emissions are likely to result. Moreover, increases in the gain of the transmission amplifier could increase the power consumption of the transmission amplifier, which may prompt thermal concerns (particularly for inefficient transmission amplifiers that create more heat when transmission power is increased due to additional gain). When a transmission amplifier generates more heat, additional thermal mitigation measures (e.g., heat sinks) are needed, which increases the cost of the access point.

As noted above, the communication path of an RF signal is a key consideration in designing and constructing an access point. The techniques described herein can be used to address the receive path, the transmit path, or both. For example, a first active element could be moved closer to the antenna (e.g., by placing an LNA or PA on the antenna circuit board) and a second active element could be moved closer to the antenna port of the access point in order to decrease the length of the communication path between the active components.

Figure 9:
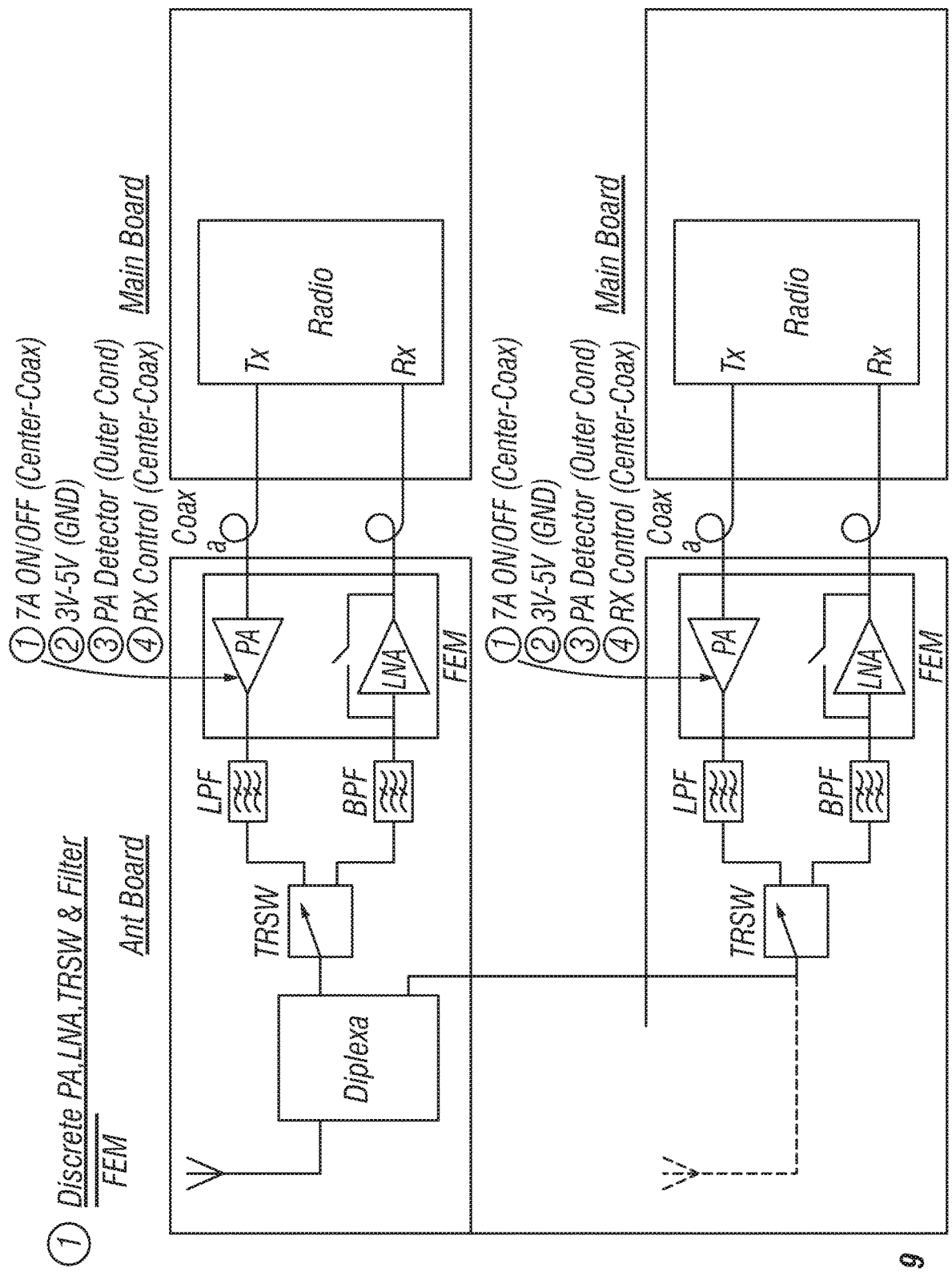
FIG. 9 depicts an isolation scheme for a center conductor that may be used in some embodiments.

FIG. 9 is a schematic diagram showing single-band and dual-band active transmission and reception antennas. Many access points are designed such that the active component(s) (e.g., the LNA and PA) are on the main circuit board within the access point housing and a cable extends between the main circuit board and an internal or external antenna. Various embodiments described herein, however, provide mechanisms that can carry supply voltages for the active component(s), RF signals from the antenna to the main circuit board, RF signals from the main circuit board to the antenna (and, more specifically, to an active component on the antenna circuit board), detector voltage that is used for power control on the main circuit board, and control line(s) required for operating various components of the access point (e.g., the LNA, PA, RF switch(es), control line(s)). The mechanisms could be, for example, coaxial cables or ribbon cables. In some embodiments, mechanisms are also included for transmitting and/or modifying digital pre-distortion-related signals. For example, the digital pre-distortion (DPD) signals may be mixed based on their transient behavior on the copper core of a coaxial cable.

Coaxial signals can be used to multiplex RF signals (as well as other signals) that have a low frequency (e.g., 2.4 GHz, sub-1 GHz). For example, the supply voltage for an active antenna assembly could be multiplexed with a low-frequency RF ground signal on the copper shield of a coaxial cable. The supply ground could also be multiplexed with a high-frequency RF ground (e.g., 5 GHz) on the copper shield of another coaxial cable. In such an arrangement, RF grounding is carried to ground by one or more capacitors as described above with respect to FIG. 5.

In some embodiments, the copper core of a coaxial cable is used to carry control signals and/or feedback voltages. Such an arrangement may be desired or necessary in situations where the transient reaction of a signal is important. In other embodiments, the copper shield of the coaxial cable is used to carry control signals and/or feedback voltages. For example, the detector voltage of an active component (e.g., a PA) may be carried on the copper shield. Such an arrangement is typically preferred when the transient reaction is less important.

Single Band Antenna Using Multiple Coaxial Cables

As shown in FIG. 9, one or more coaxial cables (corresponding to one or more frequency bands) could be used to connect an active antenna assembly to the main circuit board of the access point. The copper core of one coaxial cable is preferably used to carry the RF signal from the active antenna assembly to the main circuit board (e.g., to an input of an active component on the main circuit board), while the copper core of another coaxial cable is preferably used to carry the RF signal from the main circuit board to the active antenna assembly (e.g., to an input of an active component on the antenna circuit board).

In some embodiments, the copper shield of one coaxial cable is used to multiplex a digital signal and the RF ground (in addition to carrying the RF signal). The copper shield of another coaxial cable may be used to multiplex in (or carry) the supply voltage for the active antenna assembly or the components within the access point housing.

Figure 10:
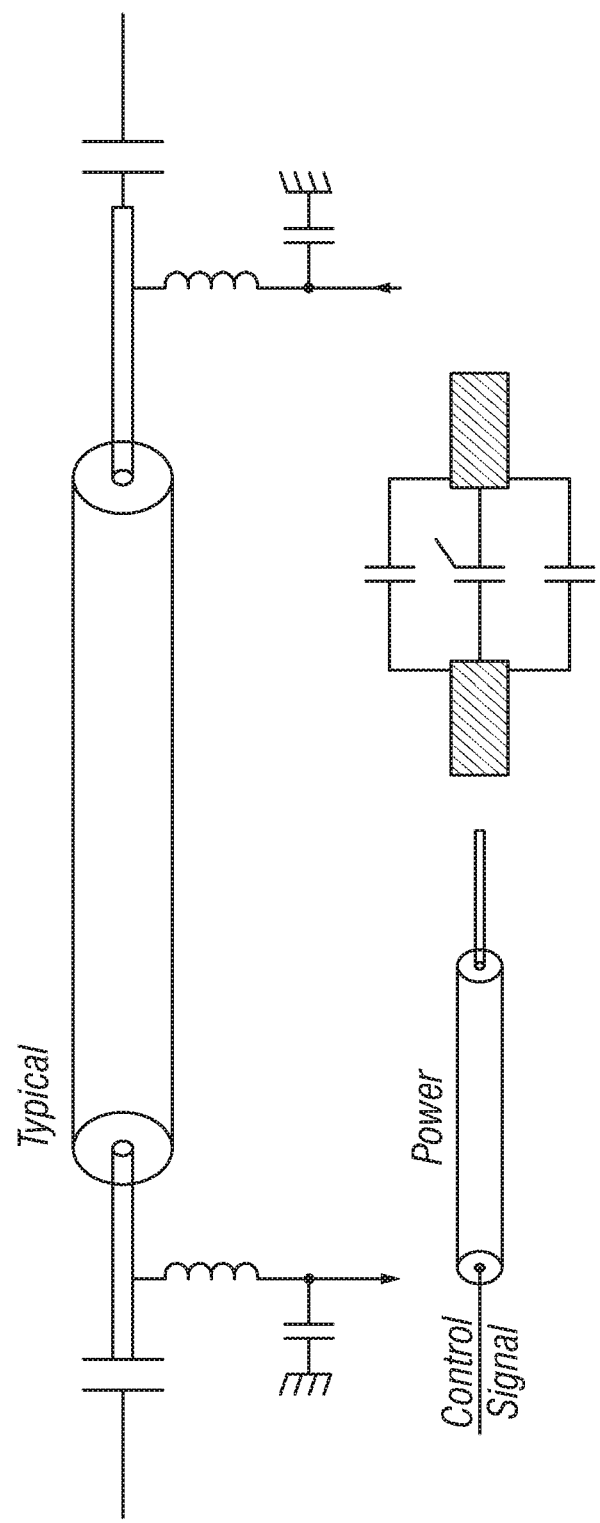
FIG. 10 depicts an isolation scheme for a center conductor that may be used in some embodiments.

FIG. 10 depicts an isolation scheme for a center conductor that may be used in some embodiments. The isolation scheme enables the copper core of a first coaxial cable to be used as the receive path (and for controlling active component(s) in the receive path), the copper core of a second coaxial cable to be used as the transmit path (and for controlling active component(s) in the transmit path), and the copper shield of one or both of the coaxial cables to be used to carry voltage. For example, a copper shield may carry envelop detector voltage from an active component (e.g., a PA) that is used to boost the power of RF signals. As further discussed above, different supply voltages may be used for signaling a user of the access point (e.g., by powering an LED on and off).

Other components that could be used in the active antenna assembly, such as an LNA, PA, or T/R switch, may be discrete components or part of one or more integrated front-end modules (FEMs).

Dual-Band Antenna Using Multiple Coaxial Cables

Dual-band antennas could also be used when multiple coaxial cables are used to connect the active antenna assembly to the main circuit board of the access point. In such embodiments, there are two bands (e.g., 2.4 GHz and 5 GHz) and each band is configured to transmit and receive RF signals. A different coaxial cable is preferably used for each band and for each transmission mode. Thus, four coaxial cables may be used to connect the active antenna assembly to the main circuit board. As noted above, the copper shield of a first coaxial cable could be used to multiplex the digital signal and an RF ground, while the copper shield of a second coaxial cable may be used to multiplex in (or carry) the supply voltage.

When an isolation scheme is employed by such a system, for each of the two bands a first coaxial cable is used as the receive path (and for controlling active component(s) in the receive path), a second coaxial cable is used as the transmit path (and for controlling active component(s) in the transmit path), and the copper shield of one or both of the coaxial cables is used to carry voltage. For example, a copper shield may carry envelop detector voltage from an active component (e.g., a PA) that is used to boost the power of RF signals. As further discussed above, different supply voltages may be used for signaling a user of the access point (e.g., by powering an LED on and off).

Remarks

The above description and drawings are meant to be illustrative and are not to be construed as limiting. Numerous details are included to provide a thorough understanding of the disclosure. However, well-known details may not be described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described that may be exhibited by some embodiments and not by others. Similarly, various requirements are described that may be requirements for some embodiments but not for other embodiments.

The terminology used in the Detailed Description is intended to be interpreted in its broadest reasonable manner, even though it is being used in conjunction with certain examples. The terms used in this specification generally have their ordinary meanings in the art, within the context of the disclosure, and in the specific context where each term is used. For convenience, certain terms may be highlighted, for example using capitalization, italics, and/or quotation marks. The use of highlighting has no influence on the scope and meaning of a term; the scope and meaning of a term is the same, in the same context, whether or not it is highlighted. It will be appreciated that the same thing can be described in more than one way. For example, one will recognize that "memory" is one form of a "storage" and that the terms may on occasion be used interchangeably.

Consequently, alternative language and synonyms may be used for any one or more of the terms discussed herein, and special significance to be placed upon whether or not a term is elaborated or discussed herein. Synonyms for certain terms are provided. A recital of one or more synonyms does not exclude the use of other synonyms. The use of examples anywhere in this specification, including examples of any term discussed herein, is meant to be illustrative only and is not intended to further limit the scope and meaning of the disclosure or of any exemplified term. Likewise, the disclosure is not limited to various embodiments given in this specification.

The language used in the Detailed Description has been principally selected for readability and instructional purposes, and it may not have been selected to delineate or circumscribe the inventive subject matter. It is therefore intended that the scope of the technology described herein be limited not by the Detailed Description, but rather by any claims on an application based hereon. Accordingly, the disclosure of various embodiments is intended to be illustrative, but not limiting, of the scope of the embodiments.

The invention claimed is:

1. A local area network (LAN) device comprising:
   an antenna assembly that includes-
      an antenna configured to receive incoming signals from, and transmit outgoing signals to, an electronic device across a network, and
      a secondary circuit board that includes a first active component; and
   a primary circuit board that includes-
      a processor configured to establish an association with the electronic device,
      a radio frequency transceiver, and
      a second active component that is connected directly to the first active component on the secondary circuit board;
   wherein the first active component is configured to
      modify the incoming signals received at the antenna before forwarding the incoming signals to the second active component, and modify the outgoing signals received from the second active component before forwarding the outgoing signals to the antenna.

2. The LAN device of claim 1, wherein the first and second active components are adjacent to one another in a communication path.

3. The LAN device of claim 1, wherein the first active component is a power amplifier configured to amplify the outgoing signals forwarded by the second active component on the primary circuit board for transmission to the electronic device.

4. The LAN device of claim 3, wherein the second active component is another power amplifier.

5. The LAN device of claim 1, wherein the first active component is a low-noise amplifier configured to improve signal-to-noise ratio of the incoming signals received by the antenna before being forwarded to the second active component on the primary circuit board.

6. The LAN device of claim 5, wherein the second active component is another low-noise amplifier.

7. The LAN device of claim 1, wherein the association is established by the processor in accordance with IEEE standard 802.11.

8. The LAN device of claim 1, further comprising:
a coaxial cable that connects the first and second active components.

9. The LAN device of claim 8, wherein the coaxial cable is one of multiple coaxial cables connected between the first and second active components, and wherein each coaxial cable corresponds to a different frequency band.

10. An antenna assembly comprising:
an antenna configured to facilitate wireless communication with an electronic device; and
a circuit board that includes-
a processor, and
an active component configured to
modify incoming signals received at the antenna before forwarding the incoming signals directly to another active component on a primary circuit board of an access point, or
modify outgoing signals received directly from the other active component on the primary circuit board of the access point before forwarding the outgoing signals to the antenna for transmission to the electronic device.

11. The antenna assembly of claim 10, wherein the active component is connected to the other active component on the primary circuit board of the access point by multiple cables.

12. The antenna assembly of claim 11, wherein each cable corresponds to a different frequency band.

13. The antenna assembly of claim 11, wherein the multiple cables include coaxial cables, ribbon cables, or any combination thereof.

14. The antenna assembly of claim 11, wherein the multiple cables includes a first cable corresponding to a 2.4 GHz frequency band and a second cable corresponding to a 5 GHz frequency band.

15. The antenna assembly of claim 11, wherein the multiple cables comprise:
a first coaxial cable that includes-
a first copper core that acts as a communication path for signals having a first frequency, and
a first copper shield responsible for carrying direct current power to the antenna assembly; and
a second coaxial cable that includes-
a second copper core that acts as a communication path for signals having a second frequency, and
a second copper shield responsible for delivering control signals to the antenna assembly.

16. The antenna assembly of claim 15, wherein the first copper shield of the first coaxial cable is grounded using one or more capacitors.

17. The antenna assembly of claim 16, wherein the one or more capacitors includes a first capacitor on the circuit board and a second capacitor on the primary circuit board of the access point.

18. The antenna assembly of claim 11, wherein the multiple cables comprise:
a first cable with a conductive shield that carries power to the antenna assembly from the primary circuit board of the access point; and
a second cable with a conductive shield that carries control signals to the antenna assembly from the primary circuit board of the access point.

* * * * *